(12) United States Patent
Wang et al.

(10) Patent No.: US 10,354,709 B2
(45) Date of Patent: Jul. 16, 2019

(54) COMPOSITE FREE MAGNETIC LAYERS

(71) Applicant: Regents of the University of Minnesota, Minneapolis, MN (US)

(72) Inventors: Jian-Ping Wang, Shoreview, MN (US); Junyang Chen, St Paul, MN (US); Mo Li, Plymouth, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 15/730,405

(22) Filed: Oct. 11, 2017

(65) Prior Publication Data
US 2018/0366172 A1 Dec. 20, 2018

Related U.S. Application Data

(60) Provisional application No. 62/521,856, filed on Jun. 19, 2017.

(51) Int. Cl.
*H01L 29/06* (2006.01)
*G11C 11/16* (2006.01)
(Continued)

(52) U.S. Cl.
CPC .......... *G11C 11/161* (2013.01); *H01L 27/222* (2013.01); *H01L 43/08* (2013.01); *H01L 43/10* (2013.01)

(58) Field of Classification Search
CPC .... H01M 10/0525; H01M 4/525; H01M 4/36; H01M 4/505; H01M 4/485; H01M 4/62; H01M 10/42; H01M 4/04; H01M 4/131; H01M 10/052; H01M 10/0562; H01M 10/0563; H01M 10/0567; H01M 10/0568; H01M 2/06; H01M 2/16; H01M 4/02; H01M 4/133; H01M 4/1391; H01M 4/1393; H01M 4/583; H01M 4/66; H01M 4/96; H01M 6/14; A24F 47/00; A24F 7/04; H01F 41/02; H01F 1/047; H01F 1/06; H01F 1/00; H01F 1/08; H01F 1/147; H01F 10/12;
(Continued)

(56) References Cited

U.S. PATENT DOCUMENTS

2005/0146955 A1* 7/2005 Kajiyama ............... B82Y 10/00
365/202
2007/0176251 A1* 8/2007 Oh ........................ B82Y 25/00
257/421
(Continued)

OTHER PUBLICATIONS

Yu et al., "Switching of Perpendicular Magnetization by Spin-Orbit Torques in the Absence of External Magnetic Fields," Nature Nanotechnology, vol. 9, Jul. 2014, pp. 548-554.
(Continued)

*Primary Examiner* — Robert G Bachner
(74) *Attorney, Agent, or Firm* — Shumaker & Sieffert, P.A.

(57) ABSTRACT

A magnetic device may include a composite free layer that includes a first sub-layer comprising at least one of a Co-based alloy, a Fe-based alloy, or a Heusler alloy; a second sub-layer comprising at least one of a Co-based alloy, a Fe-based alloy, or a Heusler alloy; and an intermediate sub-layer between the first sub-layer and the second sub-layer. The composite free layer exhibits a magnetic easy axis oriented out of a plane of the composite free layer.

30 Claims, 11 Drawing Sheets

(51) Int. Cl.
*H01L 43/10* (2006.01)
*H01L 43/08* (2006.01)
*H01L 27/22* (2006.01)

(58) Field of Classification Search
CPC . H01F 10/32; H01F 1/01; H01F 1/053; H01F 1/055; H01F 1/057; H01F 1/059; H01F 1/10; H01F 1/34; H01F 41/14; H01F 41/22; H01F 7/02; C07F 7/02; C07F 11/00; C07F 7/10; H05B 3/44; H05B 6/64; H05B 6/68; H05B 6/70; C22C 38/00; C22C 21/08; C22C 29/16; C22C 33/02; C23C 14/34; C23C 16/455; C23C 8/26; C23C 16/34; C23C 14/35; C23C 14/54; C23C 16/40; C23C 16/50; C23C 16/56; C23C 8/80; C23C 14/00; C23C 14/06; C23C 14/14; C23C 14/16; C23C 14/22; C23C 14/48; C23C 14/56; C23C 14/58; C23C 16/30; C23C 16/513; C23C 18/12; C23C 28/00; G11C 11/16; G11C 11/18; G11C 11/15; G11C 11/22; G11C 11/24; G11C 19/00; G11C 19/08; A61K 31/704; A61K 49/00; A61K 31/4409; A61K 36/185; A61K 51/04; A61K 51/06; A61K 31/01; A61K 31/015; A61K 31/045; A61K 31/05; A61K 31/352; A61K 31/355; A61K 31/454; A61K 31/517; A61K 31/5377; A61K 31/655; A61K 33/24; A61K 36/06; A61K 38/21; A61K 39/395; A61K 41/00; A61K 47/22; A61K 47/26; A61K 47/40; A61K 47/44; A61K 49/18; A61K 51/10; B01J 23/34; B01J 35/06; B01J 37/08; B01J 20/04; B01J 20/28; B01J 21/06; B01J 21/10; B01J 23/10; B01J 23/22; B01J 35/00; B01J 37/00; B01J 37/03; B01J 37/10; B01J 20/06; B01J 20/20; B01J 20/30; B01J 20/32; B01J 21/02; B01J 21/18; B01J 23/02; B01J 23/04; B01J 23/30; B01J 27/22

See application file for complete search history.

(56) References Cited

U.S. PATENT DOCUMENTS

| 2010/0072524 | A1* | 3/2010 | Huai | B82Y 10/00 257/295 |
|---|---|---|---|---|
| 2011/0007421 | A1* | 1/2011 | Hara | B82Y 25/00 360/234.3 |

OTHER PUBLICATIONS

You et al., "Switching of Perpendicularly Polarized Nanomagnets with Spin Orbit Torque without an External Magnetic Field by Engineering a Tilted Anisotropy," Proceedings of the National Academy of Sciences of the United States of America (PNAS), vol. 112, No. 33, Aug. 18, 2015, pp. 10310-10315.
Fukami et al., "Magnetization Switching by Spin-Orbit Torque in an Antiferromagnet-Ferromangnet Bilayer System," Nature Materials, vol. 15, May 2016, pp. 535-542.
Oh et al., "Field-Free Switching of Perpendicular Magnetization Through Spin-Orbit Torque in Antiferromagnet/Ferromagnet/Oxide Structures," Nature Nanotechnology, vol. 11, Oct. 2016, pp. 878-885.
Lau et al., "Spin-Orbit Torque Switching Without an External Field Using Interlayer Exchange Coupling," Nature Nanotechnology, vol. 11, Sep. 2016, pp. 758-762.
Van Den Brink et al., "Field-Free Magnetization Reversal by Spin-Hall Effect and Exchange Bias," Nature Communications, vol. 7, No. 10584, Mar. 4, 2016, 20 pp.
Zhao et al., "External Field Free Spin Hall Switching of Perpendicular Magnetic Nanopillar with a Dipole-Coupled Composite Structure," arXiv:1603.09624, Feb. 8, 2016, 30 pp.
Kong et al., "Field-Free Spin Hall Effect Driven Magnetization Switching in Pd/Co/IrMn Exchange Coupling System," Applied Physics Letter, vol. 109, No. 132402, Sep. 26, 2016, 5 pp.
DC et al., "Room-Temperature Perpendicular Magnetization Switching Through Giant Spin-Orbit Torque From Sputtered BixSe(1-x) Topological Insulator Material," University of Minnesota, Mar. 10, 2017, 14 pp.
Brataas et al., "Spin-Orbit Torques in Action," Nature Nanotechnology, vol. 9, Feb. 2014, pp. 86-88.
Cubukcu et al., "Spin-Orbit Torque Magnetization Switching of a Three-Terminal Perpendicular Magnetic Tunnel Junction," Applied Physics Letters, vol. 104, No. 042406, Jan. 30, 2014, 5 pp.
Hals et al., "Phenomenology of Current-Induced Spin-Orbit Torques," Physical Review B, vol. 88, No. 085423, Aug. 20, 2013, 5 pp.
Manchon et al., "Theory of Spin Torque Due to Spin-Orbit Coupling," Physical Review B, vol. 79, No. 94422, Mar. 23, 2009, 9 pp.
Wang et al., "Spin-Orbit-Coupled Transport and Spin Torque in a Ferromagnetic Heterostructure," Physical Review B, vol. 89, No. 054405, Feb. 7, 2014, 11 pp.
Liu et al., "Spin-Torque Switching with the Giant Spin Hall Effect of Tantalum," Science, vol. 336, May 4, 2012, pp. 555-558.
Liu et al., "Current-Induced Switching of Perpendicularly Magnetized Magnetic Layers Using Spin Torque from the Spin Hall Effect," Physical Review Letters, vol. 109, No. 096602, Aug. 31, 2012, 5 pp.
Pai et al., "Spin Transfer Torque Devices Utilizing the Giant Spin Hall Effect of Tungsten," Applied Physics Letters, vol. 101, Aug. 2012, 18 pp.
Zhao et al., "Spin Hall Switching of the Magnetization in Ta/TbFeCo Structures with Bulk Perpendicular Anistropy," Applied Physics Letters, vol. 106, No. 132404, Mar. 30, 2015, 4 pp.
Miron et al., "Current-driven Spin Torque Induced by the Rashba Effect in a Ferromagnetic Metal Layer," Nature Materials, vol. 9, Mar. 2010, pp. 11 pp.
Jamali et al., "Giant Spin Pumping and Inverse Spin Hall Effect in the Presence of Surface and Bulk Spin-Orbit Coupling of Topological Insulator Bi2Se3," Nano Letters, ACS Publications, Sep. 14, 2015, pp. 7126-7132.
Mellnik et al., "Spin Transfer Torque Generated by a Topological Insulator," Nature, vol. 511, Jul. 24, 2014, pp. 449-451.
Fan et al., "Magnetization Switching Through Giant Spin-Orbit Torque in a Magnetically Doped Topological Insulator Heterostructure," Nature Materials, Apr. 28, 2014, 6 pp.
Sinova et al., "Spin Hall Effects," Reviews of Modern Physics, vol. 87, Oct.-Dec. 2015, pp. 1213-1260.
Hoffmann, "Spin Hall Effects in Metals," IEEE Transactions on Magnetics, vol. 49, No. 10, Oct. 2013, pp. 5172-5193.
Brataas et al., "Current-Induced Torques in Magnetic Materials," Nature Materials, vol. 11, May 2012, pp. 372-381.
Slonczewski, "Current-Driven Excitation of Magnetic Multilayers," Journal of Magnetism and Magnetic Materials, vol. 159, Dec. 19, 1996, pp. L1-L7.
Chappert et al., "The Emergence of Spin Electronics in Data Storage," Nature Materials, vol. 6, Dec. 2007, 28 pp.
Kryder et al., "After Hard Drives—What Comes Next," IEEE Transactions on Magnetics, vol. 45, No. 10, Oct. 2009, pp. 3406-3413.
Kim et al., "Layer Thickness Dependence of the Current-Induced Effective Field Vector in Ta/CoFeB/MgO," Nature Materials, vol. 12, Mar. 2013, 6 pp.
Miron et al., "Perpendicular Switching of a Single Ferromagnetic Layer Induced by In-Plane Current Injection," Nature, vol. 476, Aug. 11, 2011, pp. 189-194.

(56) References Cited

OTHER PUBLICATIONS

Fan et al., "Observation of the Nonlocal Spin-Orbital Effective Field," Nature Communications, Apr. 30, 2012, 7 pp.
Hao et al., "Giant Spin Hall Effect and Switching Induced by Spin-Transfer Torque in a W/Co40Fe40B20/MgO Structure with Perpendicular Magnetic Anisotropy," Physical Review Applied, vol. 3, No. 034009, Mar. 26, 2015, 6 pp.
Jamali et al., "Planar Hall Effect Based Characterization of Spin Orbital Torques in Ta/CoFeb/MgO Structures," Journal of Applied Physics, vol. 119, No. 133902, Apr. 1, 2016, pp. 5 pp.
Kawaguchi et al., "Current-Induced Effective Fields Detected by Magnetotrasport Measurements," Applied Physics Express, vol. 6, No. 113002, Oct. 18, 2013, 4 pp.
Kawaguchi et al., "Layer Thickness Dependence of Current Induced Effective Fields in Ferromagnetic Multilayers," Journal of Applied Physics, vol. 117, No. 17C730, Mar. 25, 2015, 3 pp.
Garello et al., "Symmetry and Magnitude of Spin-Orbit Torques in Ferromagnetic Heterostructures," Nature Nanotechnology, vol. 8, Aug. 2013, pp. 587-593.
Xu et al., "Scaling Law of Anamalous Hall Effect in Fe/Cu Bilyers," The European Physical Journal B, vol. 65, Jul. 3, 2008, pp. 233-237.
Li et al., "Large-Area Synthesis of High-Quality and Uniform Graphene Films on Copper Foils," Science, vol. 324, Jun. 5, 2009, pp. 1312-1314.
Ni et al., "Magnetotransport Study of (SB1-xBix)2 Te3 Thin Films on Mica Substrate for Ideal Topological Insulator," AIP Advances, vol. 6, No. 055812, Feb. 29, 2016, 6 pp.
Emori et al., "Current-Driven Dynamics of Chiral Ferromagnetic Domain Walls," Nature Materials, Jun. 16, 2013, 6 pp.
Bhowmik et al., "Deterministic Domain Wall Motion Orthogonal to Current Flow Due to Spin Orbit Torque," Scientific Reports, vol. 5, No. 11823, Jul. 3, 2015, 10 pp.
Khvalkovsky et al., "Matching Domain-Wall Configuration and Spin-Orbit Torques for Efficient Domain-Wall Motion," Physical Review B, vol. 87, No. 020402, Jan. 2013, 5 pp.
Berger, "Motion of a Magnetic Domain Wall Traversed by Fast-Rising Current Pulses," Journal of Applied Physics, vol. 71, No. 6, Mar. 15, 1992, pp. 2721-2726.
Yamaguchi et al.,"Real-Space Observation of Current-Driven Domain Wall Motion in Submicron Magnetic Wires," Physical Review Letters, vol. 92, No. 7, Feb. 20, 2004, 4 pp.
Liu et al., "Spin-Torque Ferromagnetic Resonance Induced by the Spin Hall Effect," Physical Review Letters, vol. 106, Jan. 21, 2011, 4 pp.
Parkin et al., "Magnetic Domain-Wall Racetrack Memory," Science Magazine, vol. 320, Apr. 11, 2008, pp. 190-194.
Miron et al., "Fast Current-Induced Domain-Wall Motion Controlled by the Rashba Effect," Nature Materials, vol. 10, Jun. 2011, pp. 419-423.
Wolf et al., "Spintronics: A Spin-Based Electronics Vision for the Future," Science Magazine, vol. 294, Nov. 16, 2001, pp. 1488-1495.
Zutic et al., "Spintronics: Fundamentals and Applications," Reviews of Modern Physics, vol. 76, No. 2, Apr. 2004, pp. 323-410.
Ralph et al., "Spin Transfer Torques, Journal of Magnetism and Magnetic Materials," vol. 320, Dec. 28, 2007, pp. 1190-1216.
Zhao et al., "Low Writing Energy and Sub Nanosecond Spin Torque Transfer Switching of In-Plane Magnetic Tunnel Junction for Spin Torque Transfer Random Access Memory," Journal of Applied Physics, vol. 109, Mar. 2011, 3 pp.
Diao, "Spin-Transfer Torque Switching in Magnetic Tunnel Junctions and Spin-Transfer Torque Random Access Memory," Journal of Physics: Condensed Matter, vol. 19, No. 16, Apr. 25, 2007, 13 pp.
Lyle et al., "Direct Communication Between Magnetic Tunnel for Non-Volatile Logic Fan-Out Architecture," vol. 97, Oct. 14, 2010, 3 pp.
Kawahara et al., "Spin-Transfer Torque RAM Technology: Review and Prospect," Microelectronics Reliability, vol. 52, Nov. 1, 2011, pp. 613-627.
Manchon et al., "Theory of Nonequilibrium Intrinsic Spin Torque in a Single Nanomagnet," Physical Review B, vol. 78, Dec. 10, 2008, 4 pp.
Meng et al., "Spin Transfer in Nanomagnetic Devices with Perpendicular Anisotropy," Applied Physics Letters, vol. 88, Apr. 26, 2006, 3 pp.
Garello et al., "Ultrafast Magnetization Switching by Spin-Orbit Torques," Applied Physics Letters, vol. 105, Nov. 24, 2014, 5 pp.
Ikeda et al., "A Perpendicular-Anisotropy CoFeB—MgO Magnetic Tunnel Junction," Nature Materials, vol. 9, Sep. 2010, pp. 721-724.
Fukami et al., "A Spin-Orbit Torque Switching Scheme with Collinear Magnetic Easy Axis and Current Configuration," Nature Nanotechnology, vol. 11, Jul. 2016, pp. 621-626.
He et al., "All-Optical Switching of Magnetoresistive Devices Using Telecom-Band Femtosecond Laser," Applied Physics Letters, vol. 107, Sep. 2015, 4 pp.
Mangin et al., "Engineered Materials for All-Optical Helicity-Dependent Magnetic Switching," Nature Materials, vol. 13, Mar. 2014, pp. 286-292.
Chen et al., "Perpendicular Exchange Bias Effect in Sputter-Deposited CoFe/IrMn Bilayers," Applied Physics Letters, vol. 104, Apr. 16, 2014, 5 pp.
Zhang et al., "Spin Hall Effects in Metallic Antiferromagnets," Physical Review Letters, vol. 113, Nov. 4, 2014, 6 pp.
Ou et al., "Strong Spin Hall Effect in the Antiferromagnetic PtMn," Physical Review B, vol. 93, Jun. 20, 2016, 6 pp.
Wang et al., "Determination of Intrinsic Spin Hall Angle in Pt," Applied Physics Letters, vol. 105, Oct. 17, 2014, 4 pp.
Nan et al., "Comparison of Spin-Orbit Torques and Spin Pumping Across NiFe/Pt and NiFe/Cu/Pt Interfaces," Physical Review B, vol. 91, Jun. 11, 2015, 9 pp.
Wu et al., "Spin-Orbit Torques in Perpendicularly Magnetized Ir22Mn78/Co20Fe60B20/MgO Multilayer," Applied Physics Letters, vol. 109, Nov. 28, 2016, 6 pp.
Yu et al., "Magnetization Switching Through Spin-Hall-Effect-Induced Chiral Domain Wall Propagation," Physical Review B, vol. 89, Mar. 25, 2014, 6 pp.
Safeer et al., "Spin-Orbit Torque Magnetization Switching Controlled by Geometry," Nature Nanotechnology, vol. 11, Feb. 2016, pp. 15 pp.
Chen et al., "Field-Free Spin-Orbit Torque Switching of Composite Perpendicular CoFeB/Gd/CoFeB Layers Utilized for Three-Terminal Magnetic Tunnel Junctions," Applied Physics Letters, vol. 111, Jul. 2017, 14 pp.
U.S. Appl. No. 15/836,421, filed Dec. 8, 2017, by Wang et al.
Chen et al., "Field-free spin-orbit torque switching of composite perpendicular CoFeB/Gd/CoFeB layers utilized for three-terminal magnetic tunnel junctions," Applied Physics Letters, published online Jul. 5, 2017, 6 pp.

* cited by examiner

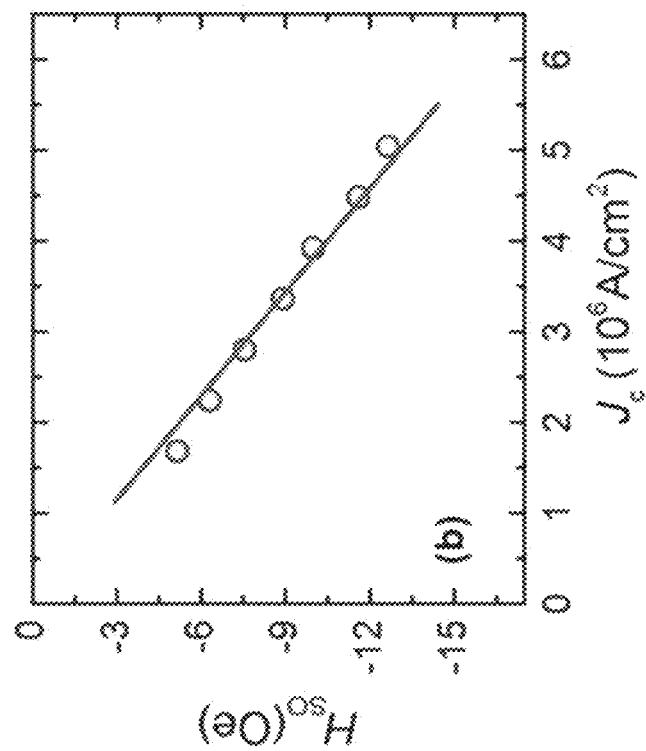
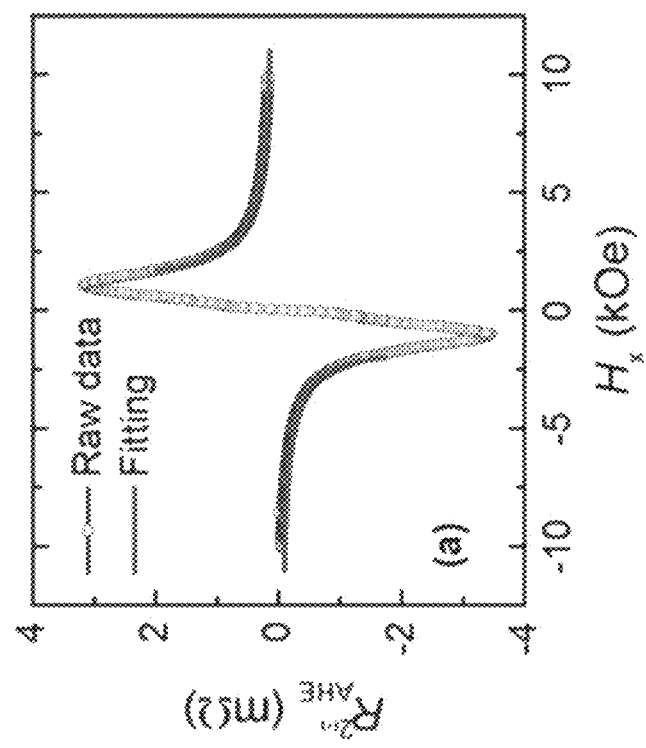
FIG. 7B
FIG. 7A

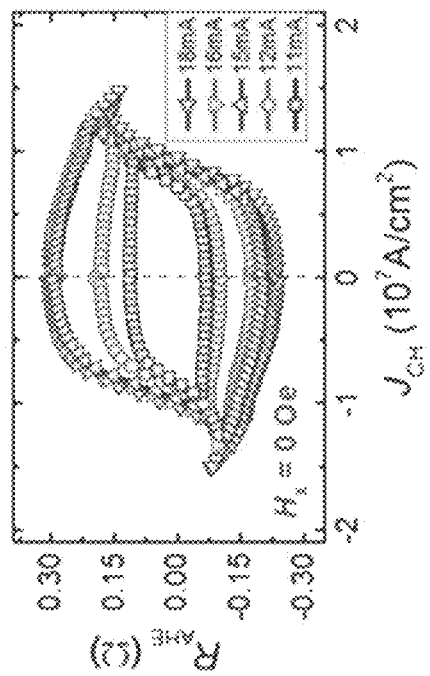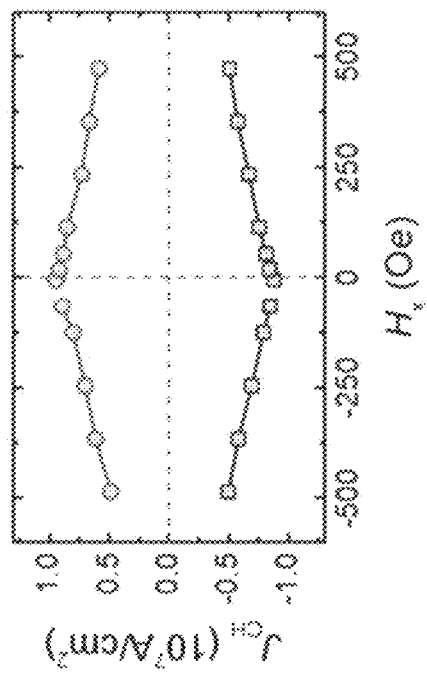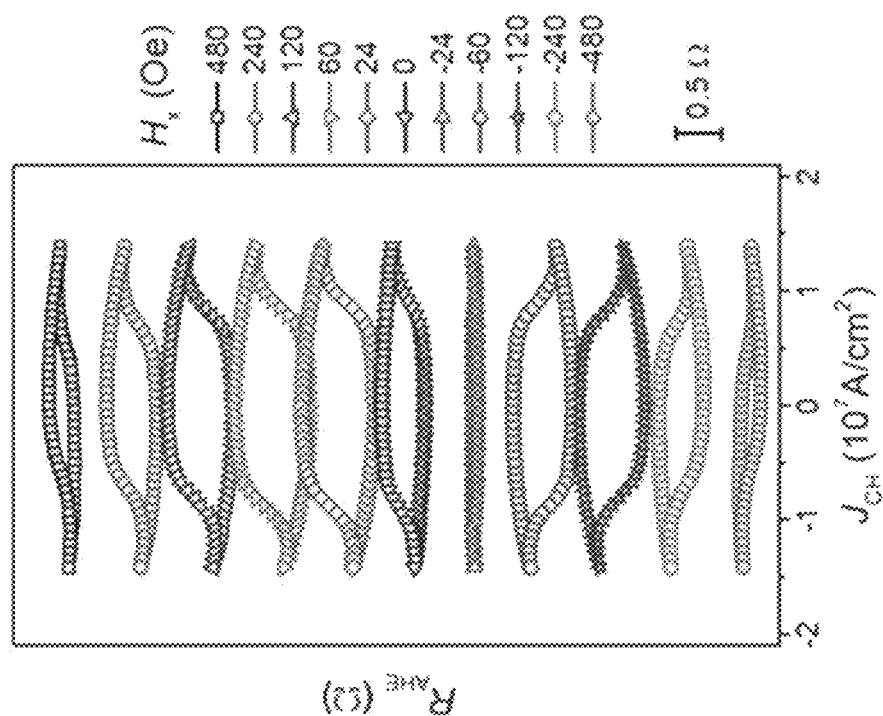

COMPOSITE FREE MAGNETIC LAYERS

This application claims the benefit of U.S. Provisional Patent Application No. 62/521,856, filed Jun. 19, 2017, the entire content of which is incorporated herein by reference.

GOVERNMENT RIGHTS

This invention was made with government support under Grant No. HR0011-13-3-0002 awarded by the Department of Defense/Defense Advanced Research Projects Agency (DARPA). The government has certain rights in the invention.

TECHNICAL FIELD

This disclosure relates to articles including magnetic structures, and more particularly, magnetic structures for memory and logic devices.

BACKGROUND

The scaling of conventional semiconductor devices may be limited by factors including device reliability and increased power consumption. Improvement in the performance of memory and computational devices is continuously pursued. Spin-based or spintronic devices may be used as alternatives to or in conjunction with electronic devices. Spin-based effects may be used by devices such as spintronic devices that harness the intrinsic spin of electrons and their associated magnetic moments, in addition to electronic phenomena that arise from the fundamental electronic charges of electrons. Magnetic structures may be used in spintronic devices including memory and computational (e.g., logic) devices.

SUMMARY

In some examples, the disclosure describes magnetic device including a composite free layer that includes a first sub-layer comprising at least one of a Co-based alloy, a Fe-based alloy, or a Heusler alloy; a second sub-layer comprising at least one of a Co-based alloy, a Fe-based alloy, or a Heusler alloy; and an intermediate sub-layer between the first sub-layer and the second sub-layer. The composite free layer exhibits a magnetic easy axis oriented out of a plane of the composite free layer.

In some examples, the disclosure describes a spin orbit torque magnetoresistive random access memory (SOT-MRAM) device including a plurality of bit lines; a plurality of word lines; and a plurality of magnetic tunnel junction devices. Each word line of the plurality of word lines defines a respective junction with each bit line of the plurality of bit lines. A respective magnetic tunnel junction device is located at each respective junction. At least one magnetic tunnel junction device of the plurality of magnetic tunnel junction devices includes a composite free layer; a reference layer; and a tunnel barrier layer between the composite free layer and the reference layer. The composite free layer may include a first sub-layer comprising at least one of a Co-based alloy, a Fe-based alloy, or a Heusler alloy; a second sub-layer comprising at least one of a Co-based alloy, a Fe-based alloy, or a Heusler alloy; and an intermediate sub-layer between the first sub-layer and the sub-second layer. The composite free layer exhibits a magnetic easy axis oriented out of a plane of the composite free layer.

The details of one or more examples are set forth in the accompanying drawings and the description below. Other features, objects, and advantages of the disclosure will be apparent from the description and drawings, and from the claims.

BRIEF DESCRIPTION OF DRAWINGS

FIG. 7A is a diagram illustrating an example second harmonic AHE resistance as a function of in-plane external magnetic field along the current channel direction measured for an example 12-μm-wide Hall bar device.

FIG. 7B is a diagram illustrating an example plot of current induced effective field as a function of ac current applied for an example 12-μm-wide Hall bar device.

FIG. 9A is a diagram illustrating example Hall resistance ($R_{AHE}$) with sweeping channel current under various in-plane external magnetic field ($H_x$) for an example 6-μm-wide Hall bar device that includes a composite free layer including CoFeB/Gd/CoFeB.

FIG. 9B is a diagram illustrating example Hall resistance with various maximum sweeping current in the absence of external magnetic fields.

FIG. 9C is a diagram illustrating example switching current density ($J_{CH}$) evaluated from the obtained loops in FIG. 9A under different in-plane external magnetic field ($H_x$).

DETAILED DESCRIPTION

Figure 1:
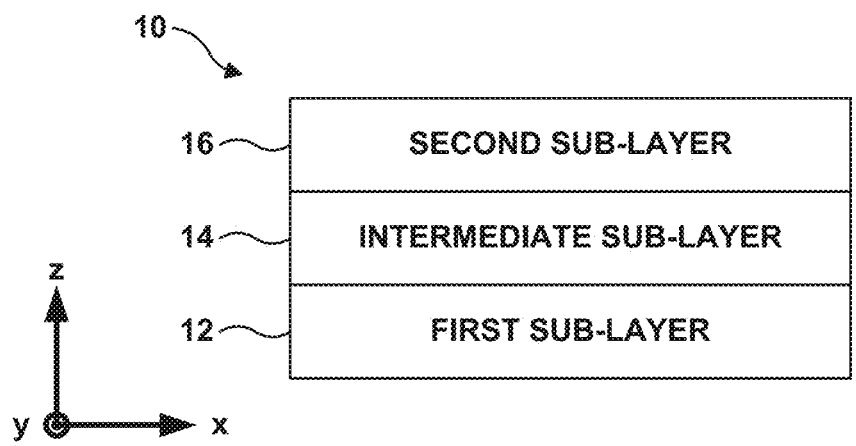
FIG. 1 is a conceptual and schematic diagram of an example composite free layer that includes a first sub-layer including at least one of a Co-based alloy, a Fe-based alloy, or a Heusler alloy; a second sub-layer comprising at least one of a Co-based alloy, a Fe-based alloy, or a Heusler alloy; and an intermediate sub-layer between the first sub-layer and the second sub-layer.

This disclosure describes composite free layers and magnetic tunnel junctions (MTJs) including composite free layers. The composite free layers described herein may include a first sub-layer, a second sub-layer, and an intermediate layer between the first and second sub-layers. The first sub-layer may include at least one of a Co-based alloy, a Fe-based alloy, or a Heusler alloy. The second sub-layer may include at least one of a Co-based alloy, a Fe-based alloy, or a Heusler alloy. In some examples, the Fe-based alloy includes $Fe_4N$. The intermediate layer may include at least one rare earth element. The intermediate layer may be antiferromagnetically coupled to at least one of the first sub-layer or the second sub-layer.

The composite free layer may include a magnetic easy axis oriented out of a plane of the composite free layer. In some examples, the magnetic easy axis may be oriented substantially perpendicular to a plane of the composite free layer, e.g., the composite free layer may possess perpendicular magnetic anisotropy. Additionally, because the intermediate layer is antiferromagnetically coupled to at least one of the first sub-layer and the second sub-layer, the saturation magnetization of the composite free layer may be relatively low (e.g., less than about 400 emu/cm³), which may result in lower critical current density ($J_C$) for switching magnetization of the composite free layer. $J_C$ can be written as:

$$J_C = \frac{2e}{\hbar} \frac{M_S t_F}{\theta_{SH}^{eff}} \left( \frac{H_K^{eff}}{2} - \frac{H_x}{\sqrt{2}} \right) \quad (1)$$

where $\theta_{SH}^{eff}$ is the effective spin Hall angle, $M_S$ is saturation magnetization, $t_F$ is the film thickness; $H_K^{eff}$ is the effective anisotropy field of the magnetic layer, and $H_x$ is the external magnetic field. Since $J_C$ is proportional to $M_S$, a magnetic layer with low $M_S$ may enable more energy efficient spin orbit torque (SOT) devices.

This disclosure describes multilayer stacks, such as composite free layers, that include first and second ferromagnetic sub-layers separated by an intermediate sub-layer. The first and second sub-layers may include a Co-based alloy, such as CoFeB; a Fe-based alloy, or a Heusler alloy. In some examples, the Fe-based alloy includes $Fe_4N$. The intermediate layer may include a rare earth element, such as gadolinium, terbium, dysprosium, or holmium. The stack has a low $M_S$ and a good perpendicular magnetic anisotropy, which is similar to GdFeCo, TbFeCo or Tb/Co multilayers. Meanwhile, this stack can be prepared on various seed layers and readily integrated with high TMR perpendicular MTJs (p-MTJs) because of the high spin-polarization of the Co-based alloy, a Fe-based alloy, or Heusler alloy. These combined features make the stack a candidate to be the free layer in p-MTJs for memory and logic applications and other magnetic heterostructures. By combining with a spin Hall channel material, SOT induced magnetization switching without an external magnetic field can be realized in this stack.

The manipulation of magnetization using electrical approaches enables energy-efficient and high performance spintronic devices. Conventional approaches using spin transfer torque (STT) derived from spin-polarized current have created magnetic memory and logic devices, including STT magnetoresistive random access memory (STT-MRAM) and magnetic tunnel junction (MTJ) based logic devices. In these devices, the key component is the MTJ with tunneling magnetoresistance (TMR) for reading and STT effect for writing. However, STT-driven magnetization switching utilizes very high critical switching current density in the range of $10^6$~$10^7$ A/cm², which is impedes energy-efficient device applications. Additionally, the high current density induces a high stress to the MgO tunnel barrier layer, which limits the number of operation cycles before the device fails.

Recently, a new magnetization switching mechanism known as SOT-induced magnetization switching has emerged. An in-plane current is injected into a non-magnet (NM)/ferromagnet (FM) bilayer structure, in which the NM layer is a spin Hall channel with large spin-orbit coupling and generates a spin current in the vertical direction. The vertical spin current, which accumulates at the interface between the NM and FM layers, exerts a Slonczewski or anti-damping torque (m×(σ×m)) and a field-like torque (m×σ) to switch the magnetization of the adjacent FM layer. Here m is the magnetization direction of the FM layer and σ is the spin polarization vector. SOT induced switching could reduce the critical current density and be more efficient than STT switching. Additionally, with SOT induced switching, the writing and reading current paths could be separated in a three-terminal configuration that could address the reliability issue of the current STT-MRAM.

Field-free SOT induced magnetization switching has been realized and demonstrated for in-plane magnetized MTJs. For memory applications, materials with perpendicular magnetic anisotropy (PMA) have advantages in terms of better thermal stability, improved scalability and faster switching. However, SOT induced magnetization switching for materials with PMA requires breaking the symmetry with an in-plane field, which is an obstacle for practical applications.

Recently, several approaches have been developed to realize a field-free SOT switching of PMA materials by introducing films with lateral asymmetry, tilted magnetic anisotropy, interlayer exchange coupling, interlayer dipole coupling, or in-plane exchange bias. The structures proposed above used a thin FM layer of either Co(Fe), CoFeB, or Co/Ni multilayers, which have a large saturation magnetization. However, large saturation magnetization leads to high critical current density. The materials described herein may allow field-free SOT induced magnetization switching of PMA materials with relatively lower critical current densities.

FIG. 1 is a conceptual and schematic diagram of an example composite free layer 10 that includes a first sub-layer 12 including at least one of a Co-based alloy, a Fe-based alloy, or a Heusler alloy; a second sub-layer 16 comprising at least one of a Co-based alloy, a Fe-based alloy, or a Heusler alloy; and an intermediate sub-layer 14 between the first sub-layer 12 and the second sub-layer 16. Composite free layer 10 may be utilized in a magnetic device, such as a magnetic tunnel junction, a domain wall-based memory or logic device, or another magnetic heterostructure.

Each of first sub-layer 12 and second sub-layer 16 may include a ferromagnetic material, such as a Co-based alloy, a Fe-based alloy, or a Heusler alloy. Example Co-based alloys include Co alloys, CoFe alloys, a CoFeB alloy, or the like. A CoFeB alloy may include, for example, $Co_{20}Fe_{60}B_{20}$. Example Fe-based alloys include $Fe_4N$. Example Heusler alloys include $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Co_2NiGa$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, or $Co_2FeGe$. In some examples, first sub-layer 12 and second sub-layer 16 may include the same composition. In other examples, first sub-layer 12 and second sub-layer 16 may include different compositions. For example, first sub-layer 12 may include a CoFeB alloy and second sub-layer 16 may include a CoFeB alloy, first sub-layer 12 may include a CoFeB alloy and second sub-layer 16 may include a Heusler alloy, first sub-layer 12 may include a Co-based alloy and second sub-layer 16 may include a CoFeB alloy, or first sub-layer 12 may include a Co-based alloy and second sub-layer 16 may include an alloy. Other combinations are possible and contemplated by this disclosure.

Intermediate sub-layer 14 may include a rare earth element, such as a rare earth element that antiferromagnetically couples to one or both of first sub-layer 12 and second sub-layer 16. For example, intermediate layer 14 may include at least one of gadolinium (Gd), terbium (Tb), dysprosium (Dy), or holmium (Ho).

The thickness of each respective layer of first sub-layer 12, intermediate sub-layer 14, and second sub-layer 16 may be selected to provide selected magnetic properties, including antiferromagnetic coupling of intermediate sub-layer 14 to at least one of first sub-layer 12 and second sub-layer 16. For example, first sub-layer 12 may define a thickness between about 0.5 nanometers (nm) and about 2 nm, intermediate sub-layer may define a thickness between about 1 nm and about 5 nm, and second sub-layer 16 may define a thickness between about 0.5 nm and about 3 nm. In some examples in which second sub-layer 16 includes CoFeB, second sub-layer 16 may define a thickness between about 1 nm and about 3 nm. In some examples in which second sub-layer 16 includes a Heusler alloy, second sub-layer 16 may define a thickness between about 0.5 nm and about 2 nm.

Composite free layer 10 may have a relatively low saturation magnetization. The relatively low saturation magnetization may be a result of antiferromagnetic coupling of intermediate sub-layer 14 to at least one of first sub-layer 12 and second sub-layer 16. In some examples, composite free layer 10 has a saturation magnetization of less than about 400 $emu/cm^3$, or less than about 370 $emu/cm^3$. This may contribute to energy efficient switching of the magnetic orientation of composite free layer 10, e.g., using SOT switching.

Composite free layer 10 may include a magnetic easy axis oriented out of a major plane of composite free layer 10. For example, FIG. 1 illustrates orthogonal x-y-z axes for purposes of illustration. A magnetic easy axis of composite free layer 10 may be oriented out of the x-y plane of FIG. 1, to which a major plane of composite free layer 10 is parallel. In some examples, the magnetic easy axis may be oriented substantially perpendicular to a plane of the composite free layer, e.g., the composite free layer may possess perpendicular magnetic anisotropy. For example, the magnetic easy axis may be oriented substantially parallel to the z-axis illustrated in FIG. 1. As described above, as composite free layer may include perpendicular magnetic anisotropy, composite free layer 10 may possess better thermal stability, improved scalability, and/or faster switching compared to materials with in-plane magnetic anisotropy.

Composite free layer 10 may be formed using any suitable technique, including, for example, sputtering, physical vapor deposition or the like.

In some examples, rather than including only a first sub-layer 12, a second sub-layer 16, and an intermediate layer 14, composite free layer 10 may include additional sub-layers. For example, the set of sub layer-intermediate layer-sub layer may be repeated multiple times within composite free layer 10, or intermediate layers may alternate with sub-layers within composite free layer 10. As one example, composite free layer 10 may further include a third sub-layer including at least one of a Co-based alloy, a Fe-based alloy, or a Heusler alloy; and a fourth sub-layer including least one of a Co-based alloy, a Fe-based alloy, or a Heusler alloy; and a second intermediate sub-layer between the third sub-layer and the fourth sub-layer. The third sub-layer may be on second sub-layer 16.

Figure 2:
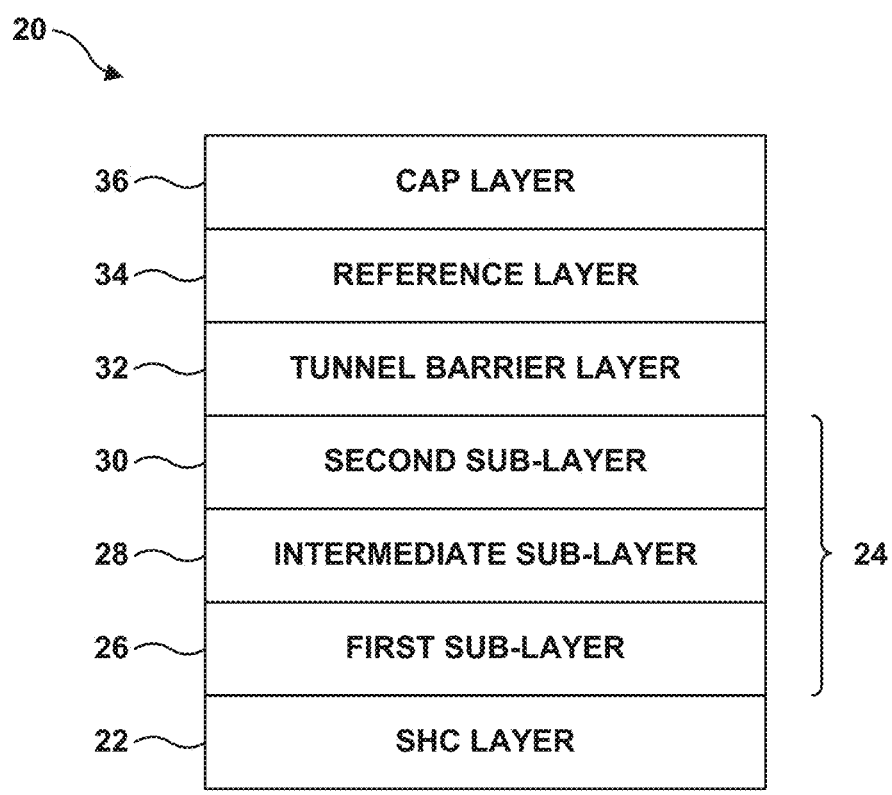
FIG. 2 is a conceptual and schematic diagram of an example magnetic tunnel junction device including a composite free layer that include a first sub-layer including at least one of a Co-based alloy, a Fe-based alloy, or a Heusler alloy; a second sub-layer comprising at least one of a Co-based alloy, a Fe-based alloy, or a Heusler alloy; and an intermediate sub-layer between the first sub-layer and the second sub-layer.

In some examples, composite free layer 10 may be incorporated in a magnetic device that includes additional layers to provide functionality of the magnetic device. For example, FIG. 2 is a conceptual and schematic diagram of an example magnetic tunnel junction (MTJ) device 20 including a composite free layer 24 that include a first sub-layer 26 including at least one of a Co-based alloy, a Fe-based alloy, or a Heusler alloy; a second sub-layer 30 comprising at least one of a Co-based alloy, a Fe-based alloy, or a Heusler alloy; and an intermediate sub-layer 28 between first sub-layer 26 and second sub-layer 30. Composite free layer 24 may be similar to or substantially the same as composite free layer 10 illustrated in and described with respect to FIG. 1.

Although not shown in FIG. 2, in some examples, MTJ device 20 may include a substrate and an optional seed layer. In some examples, the substrate may include a semiconductor, such as silicon, germanium, silicon carbide, boron nitride, boron phosphide, boron arsenide, gallium arsenide, or the like. In some examples, the substrate may include multiple layers, such as a bulk layer and an oxide layer on the bulk layer. For example, the substrate may include silicon and a silica layer on the silicon.

The optional seed layer may increase adhesion of overlying layers to the substrate. In some examples, the seed layer additionally or alternatively may act as a template establishing a preferred crystal growth direction, spacing, or the like, for an overlying layer, including SHC layer 22, composite free layer 24, or the like. The seed layer may include, for example, MgO, Ta, Ru, Cr, W, Cu, Ti, Pt, Pd, or the like.

MTJ device 20 may include a spin Hall channel (SHC) layer 22. SHC layer 22 may include any material that generates a SOT when a current (e.g., spin polarized current) is conducted through SHC layer 22 and may also be referred to as a SOT generating layer. In some examples, SHC layer 22 may include a topological insulator, a heavy metal, a heavy metal alloy, a heavy metal multilayer structure, a Mn alloy, or the like. Example heavy metals include Ta, W, Pt, or the like. Example heavy metal alloys include TaW. Example heavy metal multilayer structures include a Ta/W multilayer structure. Example topological insulators include $Bi_2Se_3$, $(Bi_{0.5}Sb_{0.5})_2Te_3$, $Ru_2Sn_3$ or the like. Example Mn alloys include PtMn, IrMn, MnAu, FeMn, NiMn, or the like. In some examples, SHC layer 22 may include at least one of $Bi_xSe_{(1-x)}$, $Bi_xTe_{(1-x)}$, $Sb_xTe_{(1-x)}$, or $(BiSb)_x(TeSe)_{(1-x)}$, where x is greater than 0 and less than 1. $Bi_xSe_{(1-x)}$, $Bi_xTe_{(1-x)}$, $Sb_xTe_{(1-x)}$, and $(BiSb)_x(TeSe)_{(1-x)}$ may exhibit a Spin Hall Angle of greater than about 3.5 at room temperature, which is may be greater than other SOT materials, such as $Bi_2Se_3$. In some examples, $Bi_xSe_{(1-x)}$, $Bi_xTe_{(1-x)}$, $Sb_xTe_{(1-x)}$, and $(BiSb)_x(TeSe)_{(1-x)}$ may exhibit a Spin Hall Angle of greater than about 5 at room temperature, greater than about 10 at room temperature, or greater than about 20 at room temperature.

In some examples, x is not 0.4. In some examples, x may be between about 0.45 and about 0.5, or may be about 0.47. In other words, in some examples, SHC layer 22 may include excess Bi, Sb, or Te compared to $Bi_2Se_3$, $Bi_2Te_3$, $Sb_2Te_3$, or $(BiSb)_x(TeSe)_{(1-x)}$. The value of x for SHC layer 22 may be determined as an average throughout a volume of SHC layer 22.

SHC layer 22 may define any desired thickness. In some examples, SHC layer 22 may define a thickness between about 4 nm and about 50 nm, or between about 4 nm and about 20 nm, or between about 4 nm and about 16 nm, or between about 10 nm and about 15 nm, or about 5 nm, or about 10 nm, or about 20 nm, or about 50 nm.

Composite free layer 24 is on SHC layer 22, and includes a first sub-layer 26, an intermediate sub-layer 28 on first sub-layer 26, and a second sub-layer 30 on intermediate sub-layer 28. Composite free layer 24 may be similar to or substantially the same as composite free layer 10 of FIG. 1, and each of first sub-layer 26, intermediate sub-layer 28, and second sub-layer 30 may be similar to or substantially the same as first sub-layer 12, intermediate sub-layer 14, and second sub-layer 16 of FIG. 1.

MTJ device 20 also includes tunnel barrier layer 32. Tunnel barrier layer 32 may include an electrically insulating material, such as MgO, $AlO_x$, or $MgAlO_x$, though which electrons must tunnel to conduct charge from composite free layer 24 to reference layer 34. Tunnel barrier layer 32 may define a thickness on the order of single digit nanometers, such as between about 1 nm and about 2.5 nm, or about 2 nm.

MTJ device 20 also includes reference layer 34 includes a ferromagnetic or ferrimagnetc material whose magnetic moment is substantially fixed for magnetic fields, STT, and SOT to which reference layer 34 is exposed during operation of device 34. In some examples, reference layer 34 may include multiple layers, such as a ferromagnetic or ferrimagnetic layer antiferromagnetically coupled to an antiferromagnetic layer. The ferromagnetic or ferrimagnetic layer may include any of the materials described above with reference to first sub-layer 26 or second sub-layer 30 of composite free layer 24.

Reference layer 34 may define any suitable thickness, such as between about 1 nm and about 10 nm, or about 5 nm.

Cap layer 36 may include any suitable material and any suitable thickness, and may include a material suitable for electrically connecting to an electrode or electrical contact. In some examples, cap layer 36 may include tantalum.

During writing of data to MTJ device 20, a spin polarized current may be conducted through at least SHC layer 22 to affect magnetic orientation of composite free layer 24. SHC layer 22 may generate SOT, may affects the magnetic moment of composite free layer 24. Depending on relative orientation of the magnetic moment of composite free layer 24 and the spin polarization of the SOT and the strength of the SOT, the SOT alone may set the orientation of the magnetic moment of composite free layer 24. In some examples, a portion of the spin polarized current may be conducted through composite free layer 24, and spin torque transfer (STT) from the spin polarized current may contribute to setting the magnetic moment of composite free layer 24. In this way, SOT, alone or in combination with STT, may be used to set magnetic orientation of composite free layer 24, which may possess an out-of-plane easy axis.

Figure 3:
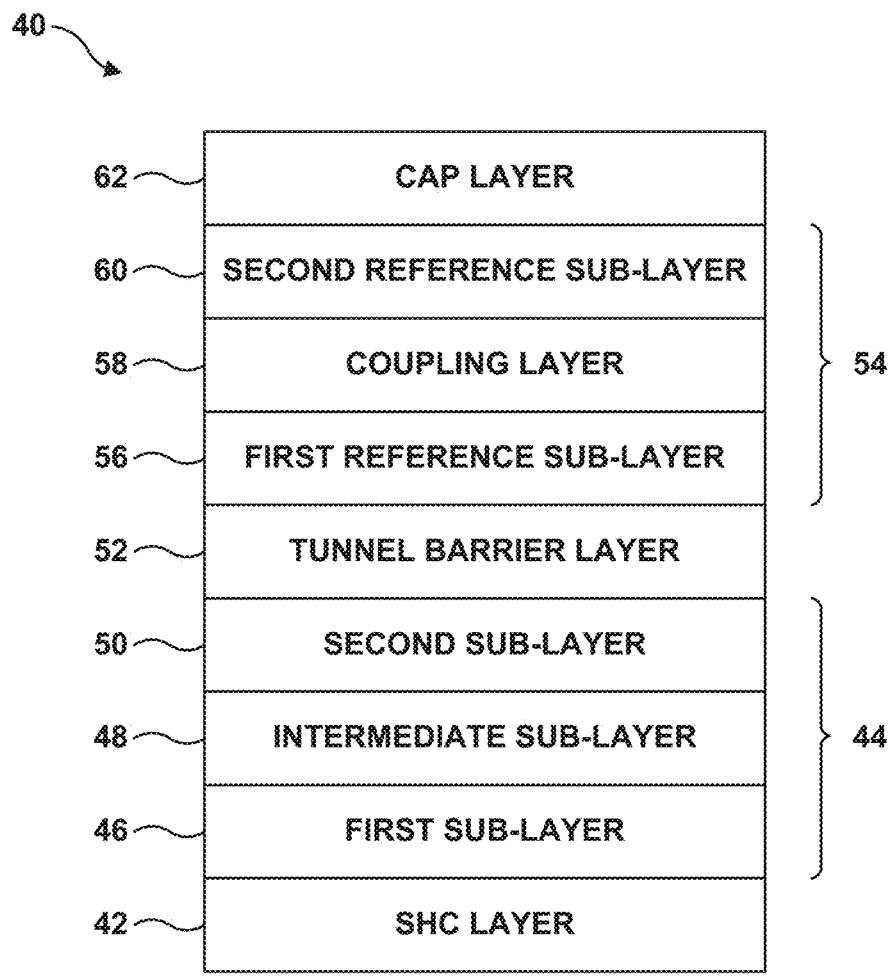
FIG. 3 is a conceptual and schematic diagram of an example magnetic tunnel junction device including a composite reference layer and a composite free layer that includes a first sub-layer including at least one of a Co-based alloy, a Fe-based alloy, or a Heusler alloy; a second sub-layer comprising at least one of a Co-based alloy, a Fe-based alloy, or a Heusler alloy; and an intermediate sub-layer between the first sub-layer and the second sub-layer.

In some examples, rather than including a single layer, a reference layer 34 may include multiple sub-layers. For example, FIG. 3 is a conceptual and schematic diagram of an example magnetic tunnel junction device 40 including a composite reference layer 54 and a composite free layer 44 that includes a first sub-layer 46 including at least one of a Co-based alloy, a Fe-based alloy, or a Heusler alloy; a second sub-layer comprising at least one of a Co-based alloy, a Fe-based alloy, or a Heusler alloy 50; and an intermediate sub-layer 48 between the first sub-layer 46 and the second sub-layer 50. MTJ device 40 may be similar to or substantially the same as MTJ device 20 of FIG. 2, aside from the differences described herein. For example, like MTJ device 20 of FIG. 2, MTJ device 40 may include a SHC layer 42, a composite free layer 44, a tunnel barrier layer 52, and a cap layer 62. Each of these layers may be similar to or substantially the same as the corresponding layers described with reference to FIG. 2.

Unlike MTJ device 20 of FIG. 2, MTJ device 40 includes a composite reference layer 54. Composite reference layer 54 includes a first reference sub-layer 56, a coupling layer 58, and a second reference sub-layer 60. First reference sub-layer 56 may include a ferromagnetic material, such as, for example CoFeB, a Co-based alloy, or Heusler alloy etc.

Coupling layer 58 may include a material that antiferromagnetically or ferromagnetically couples to at least one of first reference sub-layer 56 or second reference sub-layer 60, or a material that causes first reference sub-layer 56 to be antiferromagnetically or ferromagnetically coupled to second reference sub-layer 60. For example, coupling layer may include Tb, Gd, Dy, Ho, or the like for antiferromagnetic coupling, or include Ta, W, or the like for ferromagnetic coupling. A thickness of coupling layer 58 may be between about 0.5 nm and about 5 nm, such as between about 1 nm and about 5 nm or between about 0.5 nm and about 1.5 nm. For example, a coupling layer 58 that includes Tb may define a thickness between about 1 nm and about 5 nm, and a coupling layer 58 that includes Ta may define a thickness between about 0.5 nm and about 1.5 nm.

Composite reference layer 54 also includes second reference sub-layer 60. Second reference sub-layer 60 may include, for example, CoFeB, a Co/Pd multilayer structure, FePt, FePd, GdFeCo, TbFeCo, or the like. In some examples, second reference sub-layer 60 may be antiferromagnetically or ferromagnetically coupled to coupling layer 58 or may be antiferromagnetically or ferromagnetically coupled to first reference sub-layer 56. For example, a second reference sub-layer 60 that includes a Co/Pd multilayer structure may be ferromagnetically coupled to a first reference sub-layer 60 using a coupling layer that includes Ta and a thickness between about 0.5 nm and about 1.5 nm. As another example, a second reference sub-layer 60 may be antiferromagnetically coupled to a coupling layer 58 that includes Tb and a thickness between about 1 nm and about 5 nm.

Figure 4:
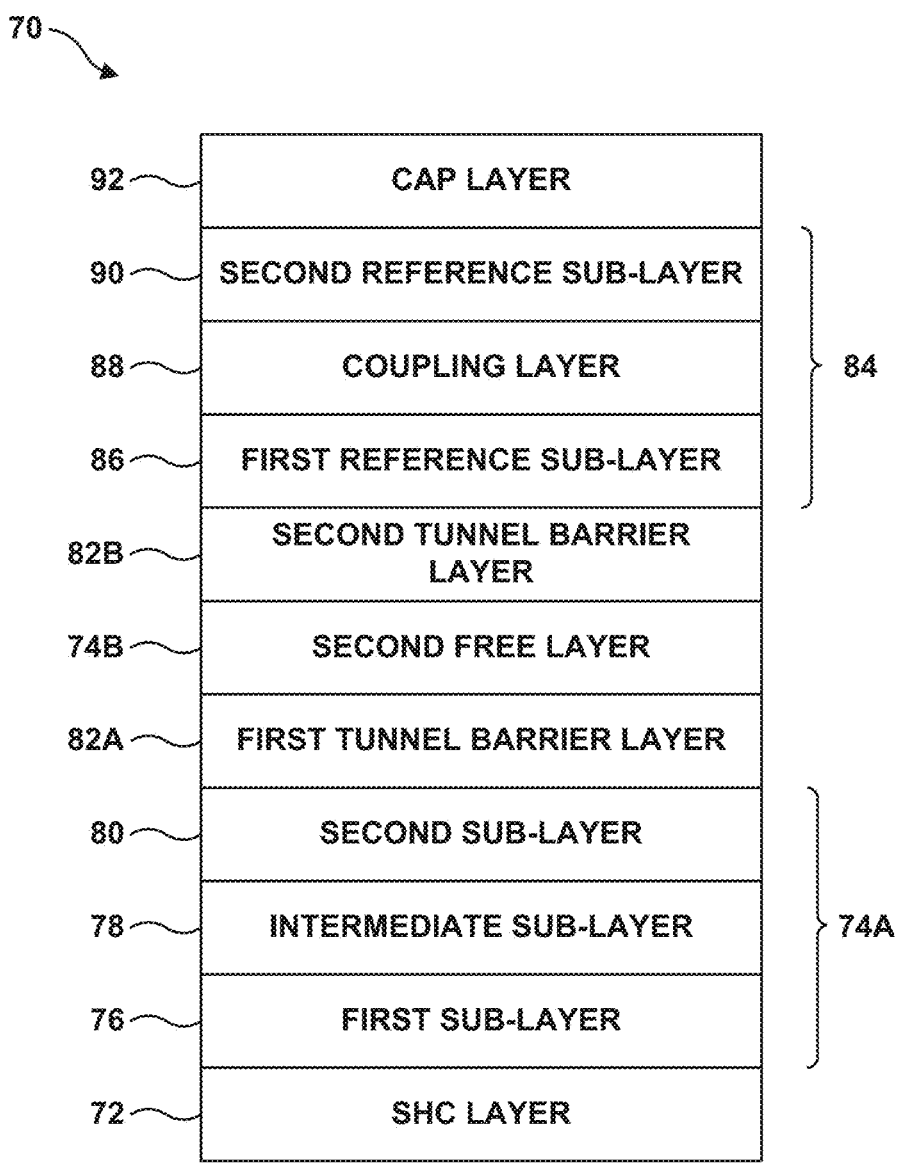
FIG. 4 is a conceptual and schematic diagram of an example magnetic tunnel junction device including a composite reference layer; a composite free layer that includes a first sub-layer including at least one of a Co-based alloy, a Fe-based alloy, or a Heusler alloy; a second sub-layer comprising at least one of a Co-based alloy, a Fe-based alloy, or a Heusler alloy; and an intermediate sub-layer between the first sub-layer and the second sub-layer; and a second free layer.

In some examples, a MTJ device may include multiple free layers, each of which may be controllably switched between magnetization states. Such a MTJ device may be used to store multiple bits of data depending on the relative magnetic orientations of a first free layer, a second free layer, and a reference layer. For example, FIG. 4 is a conceptual and schematic diagram of an example MTJ device 70 including a composite reference layer 84; a composite free layer 74A that includes a first sub-layer 76 including at least one of a Co-based alloy, a Fe-based alloy, or a Heusler alloy; a second sub-layer 80 comprising at least one of a Co-based alloy, a Fe-based alloy, or a Heusler alloy; and an intermediate sub-layer 78 between the first sub-layer 76 and the second sub-layer 80; and a second free layer 74B. MTJ device 70 may be similar to or substantially the same as MTJ device 40 of FIG. 3, aside from the differences described herein. For example, like MTJ device 40 of FIG. 3, MTJ device 70 may include a SHC layer 72, a composite free layer 74A, a first tunnel barrier layer 82A that is on first composite free layer 74A, a composite reference layer 84, and a cap layer 92. Each of these layers may be similar to or substantially the same as the corresponding layers described with reference to FIG. 3. For example, reference layer 84 may include a first reference sub-layer 86, a coupling layer 88, and a second reference sub-layer 90.

Unlike MTJ device 40 of FIG. 3, MTJ device 70 of FIG. 4 includes a second free layer 74B on first tunnel barrier layer 82A and a second tunnel barrier layer 82B on second free layer 74B. Second tunnel barrier layer 82B may be similar to or substantially the same as first tunnel barrier layer 82A. For example, second tunnel barrier layer 82B may include MgO, and may define a thickness between about 1 nm and about 2.5 nm, such as about 2 nm.

Second free layer 74B may include a ferromagnetic material, such as, for example, a Co-based alloy, such as a CoFe alloy or CoFeB, a Fe-based alloy, or a Heusler alloy. Second free layer may define a thickness between about 0.5 nm and about 2 nm, such as between about 1 nm and about 1.5 nm.

Composite free layer 74A and second free layer 74B may be independently switchable, e.g., the orientation of the magnetic moment of composite free layer 74A may be switched separately from the orientation of the magnetic moment of second free layer 74B. For example, by applying a higher amplitude current to SHC layer 72, the orientations of the magnetic moments of both composite free layer 74A and second free layer 74B may be switched or controlled. By applying a lower amplitude current to SHC layer 72, only the magnetic moment of composite free layer 74A may be switched or controlled. In this way, external magnetic field-free switching of the orientation of the magnetic moments of two free layers may be accomplished using SOT. This may allow an increase in storage density of a data storage device utilizing MTJs.

Figure 5:
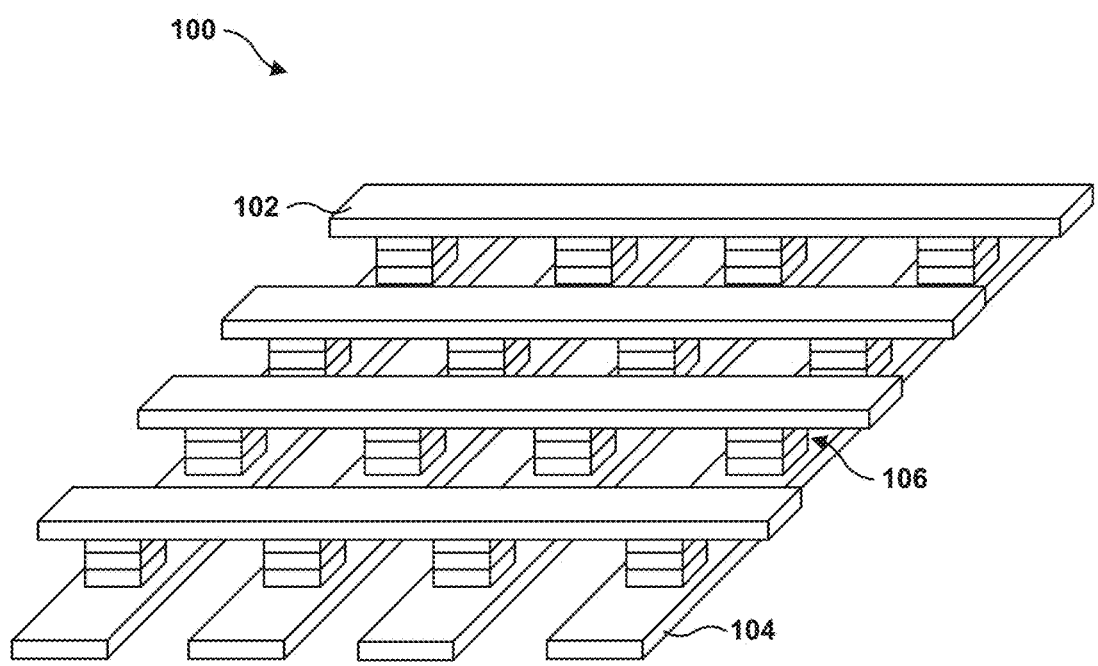
FIG. 5 is a conceptual and schematic diagram of an example spin orbit torque magnetoresistive random access memory (SOT-MRAM) device that includes a plurality of magnetic tunnel junction devices, at least one magnetic tunnel junction device of the plurality of magnetic tunnel junction devices including a composite free layer that includes a first sub-layer comprising at least one of a Co-based alloy, a Fe-based alloy, or a Heusler alloy; a second sub-layer comprising at least one of a Co-based alloy, a Fe-based alloy, or a Heusler alloy; and an intermediate sub-layer between the first layer and the second layer.

In some examples, a plurality of MTJs may be incorporated in a data storage device, such as a spin orbit torque magnetoresistive random access memory (SOT-MRAM) device. FIG. 5 is a conceptual and schematic diagram of an example SOT-MRAM device 100 that includes a plurality of MTJ devices 106, at least one MTJ of the plurality of MTJ devices including a composite free layer that includes a first sub-layer comprising at least one of a Co-based alloy, a Fe-based alloy, or a Heusler alloy; a second sub-layer comprising at least one of a Co-based alloy, a Fe-based alloy, or a Heusler alloy; and an intermediate sub-layer between the first layer and the second layer. Each of the MTJ devices 106 may be similar to or substantially the same as MTJ device 20, MTJ device 40, or MTJ device 70. SOT-MRAM device 100 also includes a plurality of bit lines 102 and a plurality of word lines 104. Further, SOT-MRAM device 100 may include a plurality of transistors, e.g., one transistor associated with each MTJ device of MTJ devices 106. During writing, a transistor associated with a selected MTJ device will be enabled, and a current will be caused to flow the word line 104 to which the MTJ device is connected. This will cause the free layer of MTJ device to be controlled (e.g., switched) using SOT. During reading, a relatively small current may be applied between a bit line 102 and a transistor associated with a selected MTJ device, to measure the tunneling magnetoresistance of the selected MTJ device.

EXAMPLES

Figure 6C:
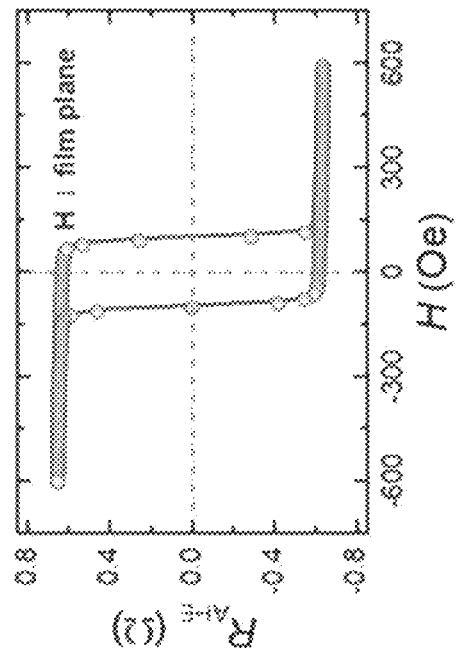
FIG. 6C is a diagram illustrating an example anomalous Hall effect (AHE) hysteresis loop of a patterned 6-μm-wide Hall bar device after setting the in-plane exchange bias by field annealing.
Figure 6D:
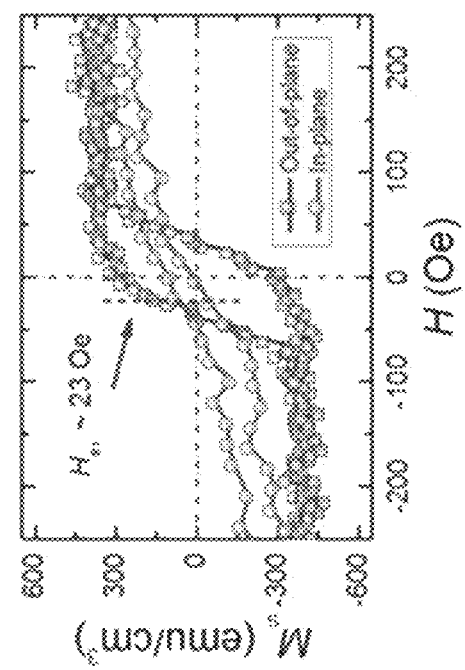
FIG. 6D is a diagram illustrating example out-of-plane and in-plane hysteresis loops of an un-patterned CoFeB/Gd/CoFeB film after field annealing, measured by vibrating sample magnetometer.
Figure 6A:
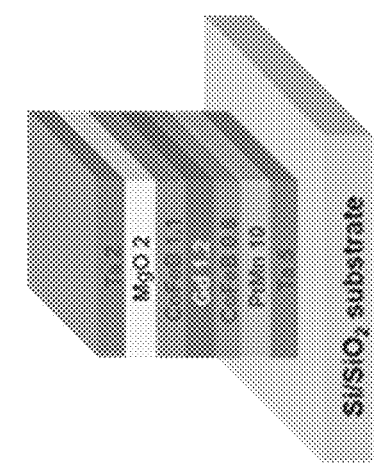
FIG. 6A is a conceptual and schematic diagram of an example film stack that includes a composite free layer including a CoFeB/Gd/CoFeB film stack.

Films were deposited onto thermally oxidized silicon wafers with a 300 nm $SiO_2$ surface layer by magnetron sputtering at room temperature (RT) in a six-target Shamrock sputter tool. The base pressure was less than $5 \times 10^{-8}$ Torr. FIG. 6A is a conceptual and schematic diagram of an example film stack that includes a composite free layer including a CoFeB/Gd/CoFeB film stack. The layer structure of the film stack was (from bottom to top) a 5 nm layer of Ta, a 10 nm layer of $Pt_{50}Mn_{50}$ (PtMn), a 0.6 nm layer of $Co_{20}Fe_{60}B_{20}$ (CoFeB), a 1.2 nm layer of Gd, a 1.1 nm layer of CoFeB, a 2 nm layer of MgO, and a 2 nm layer of Ta, as shown in FIG. 6A. The thickness of each layer was selected to achieve a good perpendicular magnetic anisotropy, as well as to be compatible with current perpendicular MTJ technology. This stack could be integrated into a MTJ by adding a reference layer.

Figure 6B:
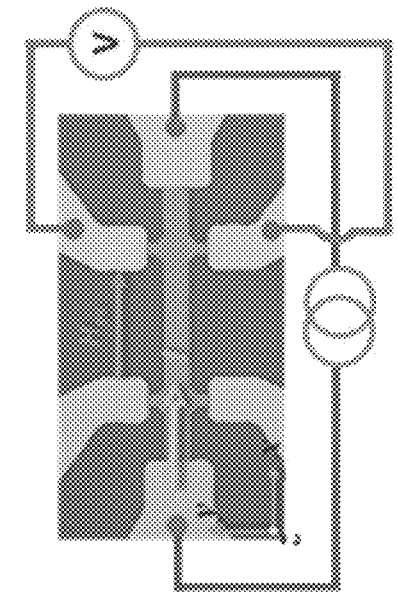
FIG. 6B is an optical micrograph of a fabricated Hall bar device and measurement configuration.

SOT induced magnetization switching was directly investigated by measuring the anomalous Hall effect (AHE) in the stack. The film was patterned into Hall bar devices using a standard photolithography and ion milling process. The Hall bar devices were annealed at about 300° C. for about half an hour while being exposed to a magnetic field of about 5 kOe along the current channel direction to set an in-plane exchange bias. FIG. 6B is an optical micrograph of a fabricated Hall bar device and measurement configuration. The width of the current channel in the Hall bar devices was either 6 μm or 12 μm.

All measurements were performed at room temperature. FIG. 6C is a diagram illustrating an example anomalous Hall effect (AHE) hysteresis loop of a patterned 6-μm-wide Hall bar device after setting the in-plane exchange bias by field annealing. The AHE hysteresis loop in FIG. 6C shows near 100% remanence, indicating a good perpendicular magnetic anisotropy. Hysteresis loops with sweeping fields in the out-of-plane and in-plane directions for an un-patterned film after the same annealing conditions were also measured with a vibrating sample magnetometer. FIG. 6D is a diagram illustrating example out-of-plane and in-plane hysteresis loops of an un-patterned CoFeB/Gd/CoFeB film after annealing. The hysteresis loops indicate good perpendicular magnetic anisotropy and weak in-plane exchange bias ($H_{ex}$~22 Oe), induced from the PtMn/CoFeB interface. A larger exchange bias is expected if an additional CoFe layer were to be inserted. Because of the antiferromagnetic exchange coupling between the Gd and CoFeB layers, their magnetizations are partially compensated by each other and a smaller Ms (~370±20 emu/cm$^3$) is obtained in the CoFeB/Gd/CoFeB stack compared to a homogeneous CoFeB free layer.

Current induced SOTs and the spin Hall angle ($\theta_{SH}$) of PtMn were determined by using a well-established second harmonic technique. An AC sinusoidal current, I=$I_{ac}$ sin (2πft), with frequency of 15.8 Hz, was applied to a 12-μm-wide Hall bar along the current channel, as shown in the FIG. 6B. The current induced alternating effective field will cause the oscillation of magnetization around its equilibrium state, which will generate a second harmonic AHE resistance ($R_{AHE}^{2\omega}$). FIG. 7A is a diagram illustrating an example second harmonic AHE resistance as a function of in-plane external magnetic field along the current channel direction measured for an example 12-μm-wide Hall bar device. As shown in FIG. 7A, the $R_{AHE}^{2\omega}$ signal with an applied ac current amplitude of 2 mA was measured by using a lock-in amplifier while sweeping a larger in-plane external magnetic field ($H_x$) along the x direction (current flow direction). When $H_x$ is larger than the saturation field ($H_k$), the CoFeB/Gd/CoFeB layers will be saturated to a single domain state. The second harmonic AHE resistance can be written as:

$$R_{AHE}^{2\omega} = -\frac{1}{2} \frac{R_{AHE} H_{SO}}{(H_x - H_K + H_{ex})} \quad (2)$$

where $R_{AHE}$ is the AHE resistance, $H_{ex}$ is the in-plane exchange bias field and $H_{SO}$ is the current induced effective field. In the Hall bar device, the $R_{AHE}$ at the saturated state was measured to be ~0.65 ohms. By fitting $R_{AHE}^{2\omega}(H_x)$ curve using equation (2) at larger $H_x$ region (as shown in FIG. 7A), the current induced effective field $H_{SO}$ can be calculated. With varying ac current applied to Hall bar devices, an $H_{SO}$ versus current density ($J_C$) curve can be obtained. FIG. 7B is a diagram illustrating an example plot of current induced effective field as a function of ac current applied for an example 12-μm-wide Hall bar device. The curve in FIG. 7B shows a linear relation. Here $J_C$ is the effective current density in the PtMn layer, which was calculated through comparing the resistivity of different layers ($\rho_{Ta}$=200 μΩ cm; $\rho_{CoFeB/Gd}$=220 μΩ cm; $\rho_{PtMn}$=160 μΩ cm). These values were measured with additional single layers. From the linear relationship, the effective anti-damping torque efficiency, defined as $H_{SO}/J_C$, was obtained from FIG. 7B and was as large as −2.61 Oe per 10$^6$ A/cm$^2$. Since the anti-damping torque is mainly originated from the spin Hall effect, the $\theta_{SH}$ of PtMn can be obtained from the anti-damping torque by using equation:

$$\theta_{SH} = -\frac{2|e|M_s t_F}{\hbar} \frac{H_{SO}}{J_C} \quad (3)$$

where |e| and $t_F$ are the absolute values of the electron charge and the magnetic CoFeB/Gd/CoFeB layers thickness, respectively. The $\theta_{SH}$ of PtMn was evaluated to be as large as ~0.084±0.005, which is comparable with previous reports. The sign and value of the $\theta_{SH}$ of PtMn in the film stack is comparable with that of Pt, which suggests that the main contribution of SOT is from Pt.

Figure 8B:
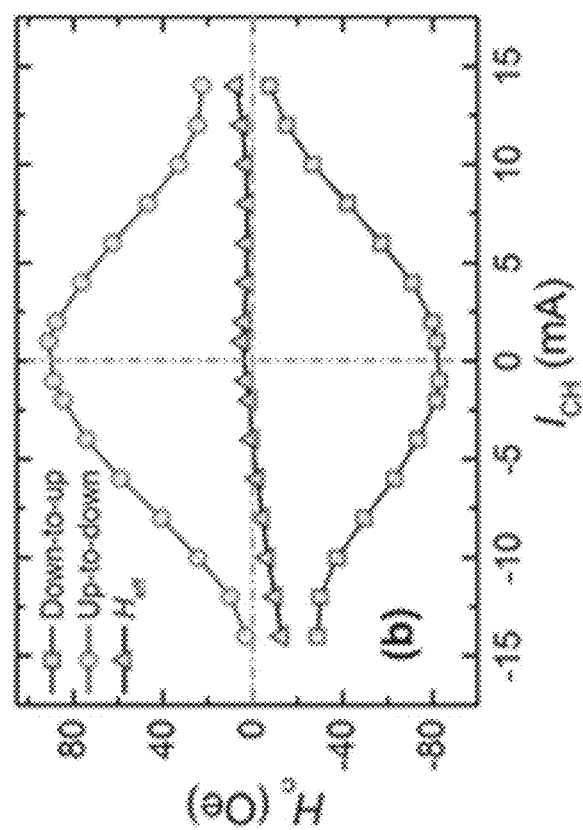
FIG. 8B is a diagram illustrating an example coercive field ($H_c$) for down-to-up and up-to-down magnetization reversal as a function of channel current ($I_{CH}$) in the absence of in-plane external magnetic field.
Figure 8A:
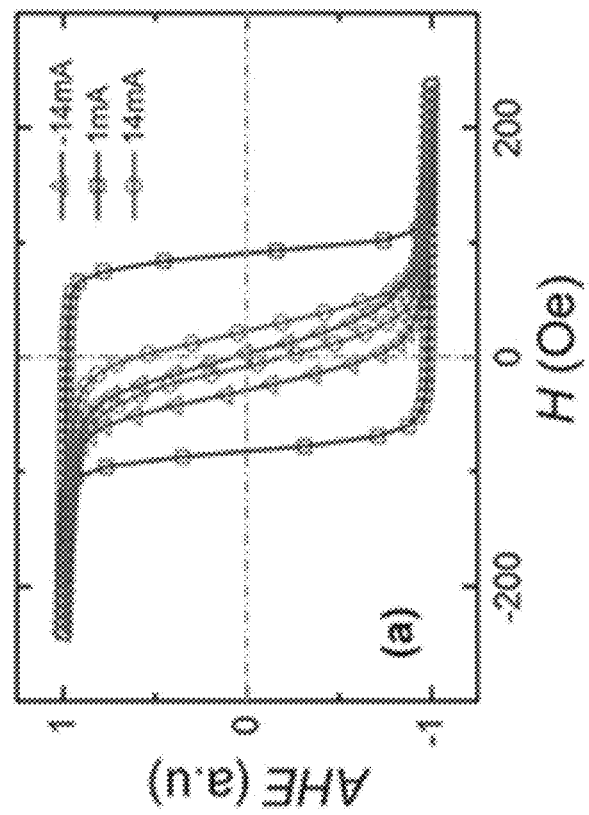
FIG. 8A is a diagram illustrating example AHE hysteresis loops measured by sweeping an out-of-plane external magnetic field with different channel currents of −14 mA, 1 mA, and 14 mA for an example 6-μm-wide Hall bar device.

The variation of $R_{AHE}$ ($H_z$) loops with a sweeping out-of-plane external magnetic field as a function of dc charge current ($I_{CH}$) is presented in FIGS. 8A and 8B. The magnitude of current induced SOT is expected to scale with $I_{CH}$. FIG. 8A is a diagram illustrating example AHE hysteresis loops measured by sweeping an out-of-plane external magnetic field with different channel currents of −14 mA, 1 mA, and 14 mA for an example 6-μm-wide Hall bar device. The loops become narrower and the coercive field ($H_c$) gradually decreases with the increase of $I_{CH}$. The reduction of $H_C$ is mainly attributed to the enhancement of current induced SOT through the spin Hall effect.

FIG. 8B is a diagram illustrating an example coercive field ($H_c$) for down-to-up and up-to-down magnetization reversal as a function of channel current ($I_{CH}$) in the absence of in-plane external magnetic field. Instead of a four-fold symmetry, the coercive force shows a two-fold symmetry, because PtMn generated an in-plane exchange bias of ~22 Oe in the CoFeB/Gd/CoFeB layers. This may imply that the sign of $I_{CH}$ determines the preferable magnetization switching direction, which indicates a field-free current induced SOT switching in the tested film stacks.

Next, the SOT induced magnetization switching of CoFeB/Gd/CoFeB layers was determined under various in-plane external magnetic field ($H_x$) along the current channel direction. FIG. 9A is a diagram illustrating example Hall resistance ($R_{AHE}$) with sweeping channel current under various in-plane external magnetic field ($H_x$) for an example 6-μm-wide Hall bar device that includes a composite free layer including CoFeB/Gd/CoFeB.

As shown in FIG. 9A, the Hall resistance ($R_{AHE}$) was measured with sweeping the channel current ranging from −18 mA to +18 mA with various $H_x$ up to ±480 Oe for the 6-μm-wide Hall bar device. At a certain $H_x$, the magnetization direction was determined by the sign of channel current, which is consistent with FIG. 8A. With the help of the in-plane exchange bias generated from PtMn, SOT induced magnetization switching was observed at zero field. However, with $H_x$=−24 Oe, there was almost no SOT induced switching, which suggests that $H_x$ is almost fully compensated by the in-plane exchange bias present in the device. When the channel current increases, instead of a sharp switching of the magnetization, the magnetization of CoFeB/Gd/CoFeB layers are gradually switched from one direction to another direction, which suggests the magnetization reversal in our devices is not coherent rotation, but possibly a domain wall motion. Similar SOT switching behaviors have also reported in many other systems.

To further confirm the mechanism of domain wall motion, the $R_{AHE}$ was measured at zero magnetic field under different maximum channel currents. FIG. 9B is a diagram illustrating example Hall resistance with various maximum sweeping current in the absence of external magnetic fields. With increasing the applied maximum channel current, the saturated $R_{AHE}$ also increases. Since $R_{AHE}$ is proportional to the magnetization, increased $R_{AHE}$ indicates more domains are reversed. However, the observed $R_{AHE}$ is a bit smaller than the anomalous Hall resistance measured with sweeping out-of-plane field shown in FIG. 6C, which suggests incomplete SOT switching possibly originated from randomly distributed pinning sites in the CoFeB/Gd/CoFeB Hall bar devices.

FIG. 9C is a diagram illustrating example switching current density ($J_{CH}$) evaluated from the obtained loops in FIG. 9A under different in-plane external magnetic field ($H_x$). The switching current density ($J_{CH}$) was calculated from FIG. 9A. Here $J_{CH}$ is defined as the total current density for the Hall bar devices. With the increase of $H_x$, $J_{CH}$ decreases, which is consistent with equation (1). By applying a parallel resistor model, the switching current density in the PtMn layer of about ~$9.6 \times 10^6$ A/cm$^2$ in the absence of an external magnetic field was determined.

Figure 10A:
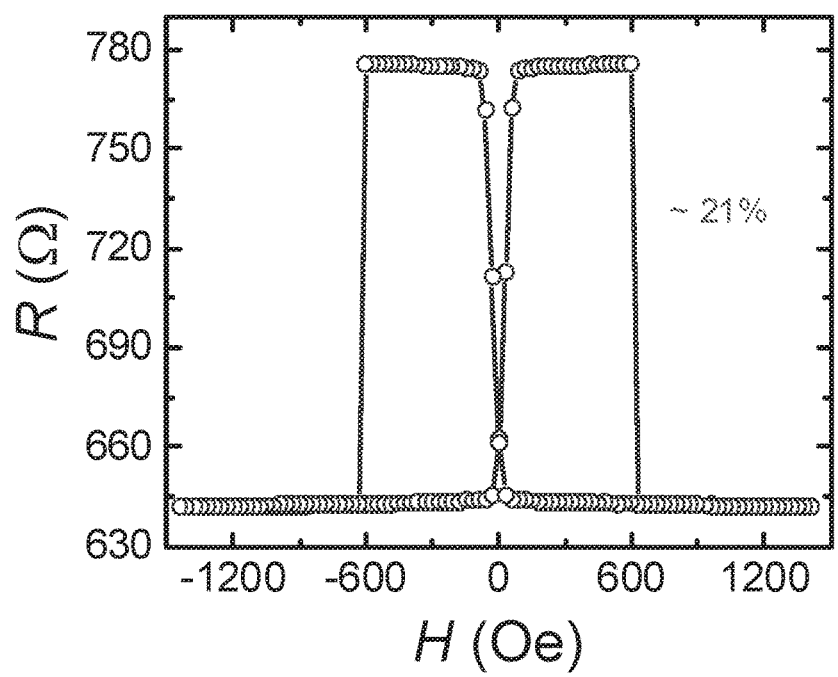
FIG. 10A is a plot illustrating resistance versus applied magnetic field for a magnetic tunnel junction.
Figure 10B:
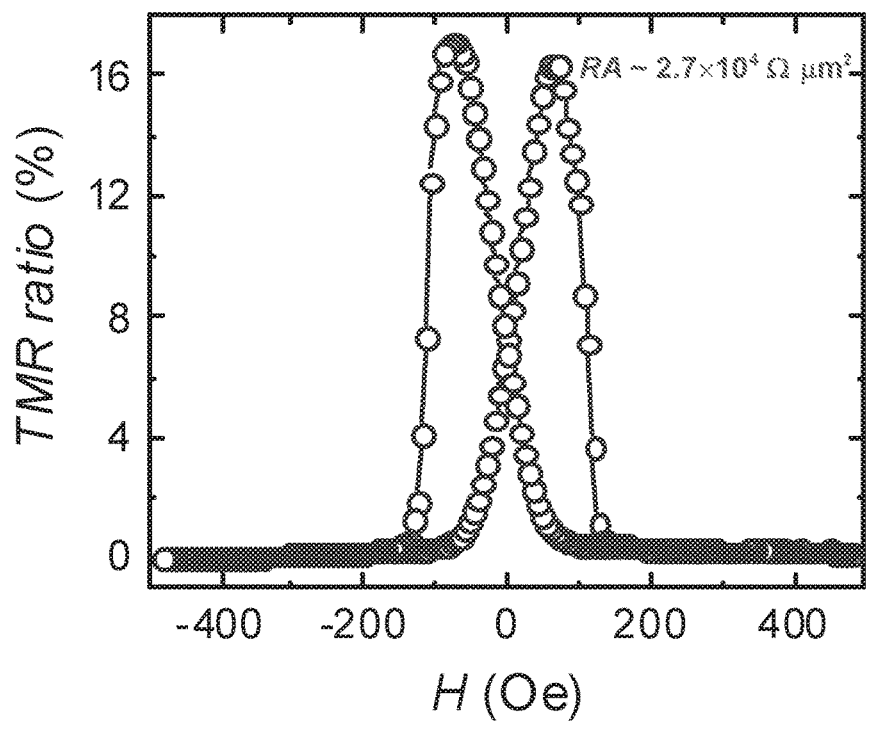
FIG. 10B is a plot illustrating tunneling magnetoresistance ratio versus applied magnetic field for a magnetic tunnel junction.

FIG. 10A is a plot illustrating resistance versus applied magnetic field for a magnetic tunnel junction. FIG. 10B is a plot illustrating tunneling magnetoresistance ratio versus applied magnetic field for a magnetic tunnel junction. The layer structure of the film stacks tested in FIGS. 10A and 10B was (from bottom to top) a 5 nm layer of Ta, a 10 nm layer of $Pt_{50}Mn_{50}$ (PtMn), a 0.6 nm layer of $Co_{20}Fe_{60}B_{20}$ (CoFeB), a 1.2 nm layer of Gd, a 1.1 nm layer of CoFeB, a 2 nm layer of MgO, and a 2 nm layer of Ta, similar to that illustrated in FIG. 6A. The film stack for FIG. 10A was annealed at about 300° C. for about 10 minutes in a Rapid Thermal Annealing (RTA) furnace, while the film stack for FIG. 10B was annealed in a vacuum with an in-plane applied magnetic field of about 4 kOe at about 300° C. for about 30 minutes. As shown in FIGS. 10A and 10B, the TMR ratio was about 21% for the sample of FIG. 10A and about 16% for the sample of FIG. 10B.

Figure 11A:
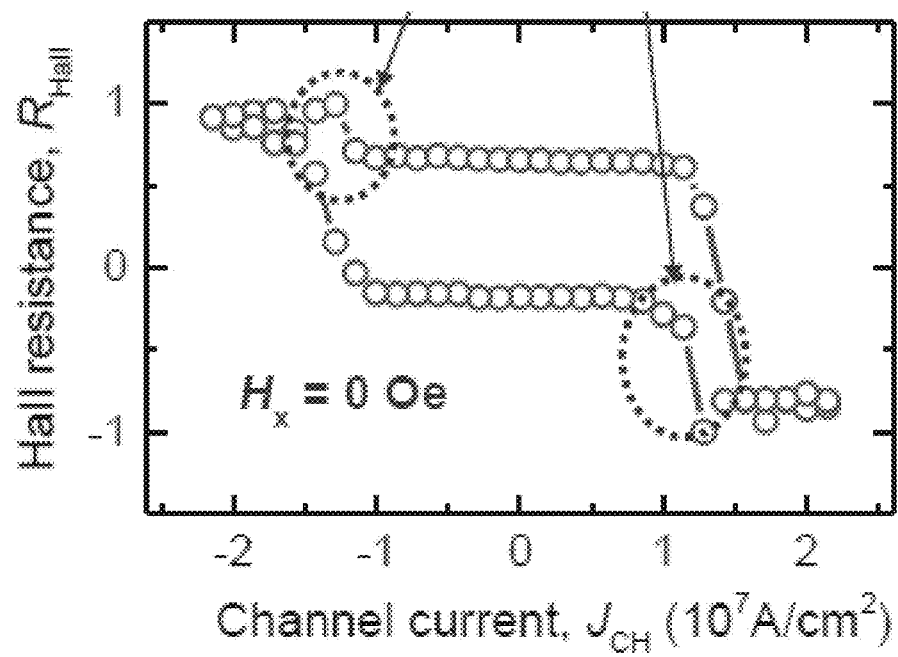
FIGS. 11A-11C are plots illustrating the Hall resistance of a magnetic tunnel junction film stack versus channel current for no applied external magnetic field, an applied external magnetic field of ±60 Oe, and an applied external magnetic field of ±360 Oe, respectively.
Figure 11B:
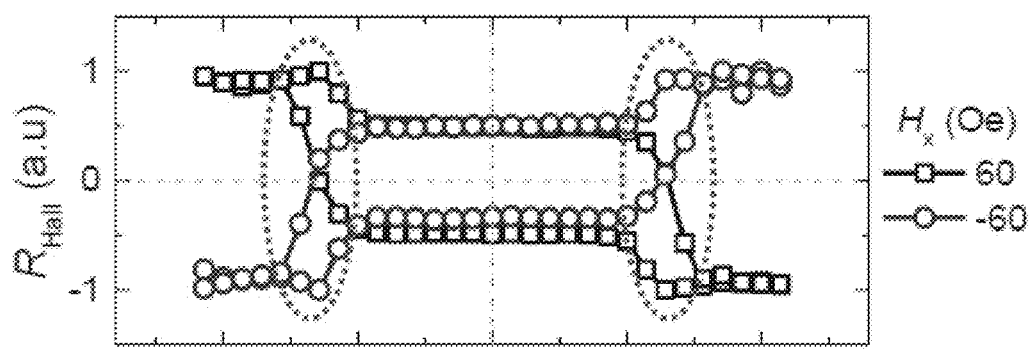
Figure 11C:
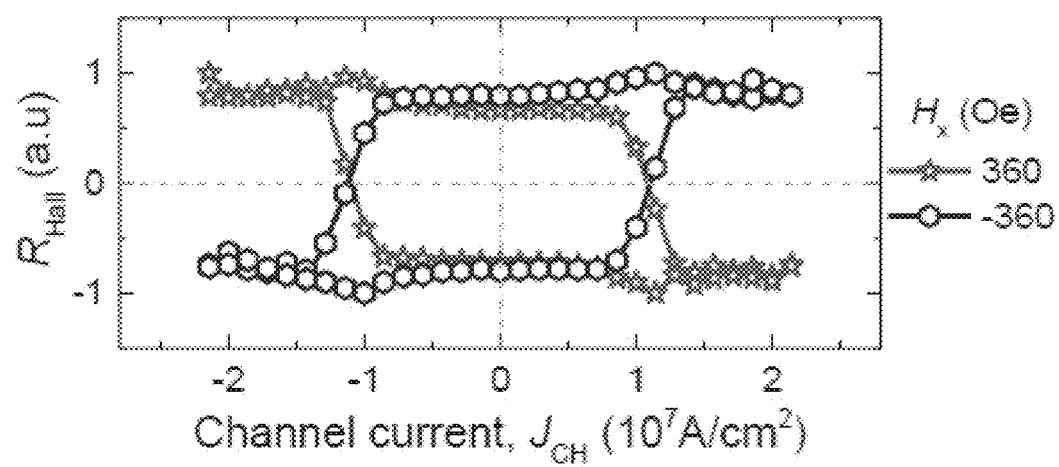

A similar film stack was exposed to various channel currents with not applied external magnetic field, a relatively low applied external magnetic field, and a relatively high applied external magnetic field. FIGS. 11A-11C are plots illustrating the Hall resistance of a film stack versus channel current for no applied external magnetic field, an applied external magnetic field of ±60 Oe, and an applied external magnetic field of ±360 Oe, respectively. As shown in FIGS. 11A and 11B, when exposed to no applied external magnetic field or an applied external magnetic field of ±60 Oe, magnetization of the CoFeB/Gd/CoFeB composite free layer was fully switched. However, when exposed to an applied external magnetic field of ±360 Oe, only the magnetizations of the bottom CoFeB layer and the Gd layer were switched. This suggests that, depending on the write current used, different free layers may be switched using SOT.

Various examples have been described. These and other examples are within the scope of the following claims.

What is claimed is:

1. A magnetic device comprising:
   a composite free layer comprising:
      a first sub-layer comprising at least one of a Co-based alloy, a Fe-based alloy, or a Heusler alloy;
      a second sub-layer comprising at least one of a Co-based alloy, a Fe-based alloy, $Fe_4N$, or a Heusler alloy; and
      an intermediate sub-layer between the first sub-layer and the sub-second layer, wherein the composite free layer exhibits a magnetic easy axis oriented out of a plane of the composite free layer.

2. The magnetic device of claim 1, wherein at least one of the first sub-layer or the second sub-layer comprises the Co-based alloy, and wherein the Co-based alloy comprises CoFeB.

3. The magnetic device of claim 1, wherein at least one of the first sub-layer or the second sub-layer comprises the Fe-based alloy, and wherein the Fe-based alloy comprises $Fe_4N$.

4. The magnetic device of claim 1, wherein the composite free layer exhibits a magnetic easy axis oriented substantially perpendicular to a major plane of the composite free layer.

5. The magnetic device of claim 1, wherein the intermediate sub-layer is antiferromagnetically coupled to at least one of the first sub-layer or the second sub-layer.

6. The magnetic device of claim 1, wherein the intermediate sub-layer comprises a rare earth element.

7. The magnetic device of claim 6, wherein the rare earth element comprises at least one of gadolinium, terbium, dysprosium, or holmium.

8. The magnetic device of claim 1, wherein:
   at least one of the first sub-layer or the second sub-layer comprises the Heusler alloy; and
   the Heusler alloy comprises at least one of $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Co_2NiGa$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, or $Co_2FeGe$.

9. The magnetic device of claim 1, wherein the composite free layer further comprises:
   a third sub-layer comprising at least one of a Co-based alloy, a Fe-based alloy, or a Heusler alloy;
   a fourth sub-layer comprising least one of a Co-based alloy, a Fe-based alloy, or a Heusler alloy; and
   a second intermediate sub-layer between the third sub-layer and the fourth sub-layer.

10. The magnetic device of claim 1, wherein the composite free layer has a saturation magnetization of less than about 400 emu/cm$^3$.

11. The magnetic device of claim 1, wherein:
   the first sub-layer defines a thickness between about 0.5 nm and about 2 nm;
   the second sub-layer defines a thickness between about 0.5 nm and about 3 nm; and
   the intermediate sub-layer defines a thickness between about 1 nm and about 5 nm.

12. The magnetic device of claim 1, wherein:
   the magnetic device comprises a magnetic tunnel junction;
   the magnetic tunnel junction comprises the composite free layer;
   the magnetic tunnel junction further further a reference layer and a tunnel barrier layer; and
   the tunnel barrier layer is between the reference layer and the composite free layer.

13. The magnetic device of claim 12, wherein the tunnel barrier layer comprises MgO, $AlO_x$, or $MgAlO_x$.

14. The magnetic device of claim 12, wherein the reference layer comprises a CoFeB alloy or multilayers.

15. The magnetic device of claim 12, further comprising a spin orbit torque (SOT) generating layer adjacent to the composite free layer, wherein the composite free layer is between SOT generating layer and the tunnel barrier layer.

16. The magnetic device of claim 15, wherein:
   the SOT generating layer comprises at least one of PtMn, IrMn, TaW alloy, Ta/W multilayer, $Bi_xSe_{(1-x)}$, $Bi_xTe_{(1-x)}$, or $Sb_xTe_{(1-x)}$, $(BiSb)_x(TeSe)_{(1-x)}$; and
   x is greater than 0 and less than 1.

17. The magnetic device of claim 12, wherein:
   the composite free layer is a first free layer and the tunnel barrier layer is a first tunnel barrier layer;
   the magnetic tunnel junction further comprises a second free layer and a second tunnel barrier layer;
   the first tunnel barrier layer is between the first free layer and the second free layer; and
   the second tunnel barrier layer is between the second free layer and the reference layer.

18. The magnetic device of claim 1, further comprising a magnetic heterostructure, wherein the magnetic heterostructure comprises the composite free layer.

19. The magnetic device of claim 1, further comprising a domain wall-based memory or logic device, wherein the domain wall-based memory or logic device comprises the composite free layer.

20. A spin orbit torque magnetoresistive random access memory (SOT-MRAM) device comprising:
a plurality of bit lines;
a plurality of word lines, wherein each word line of the plurality of word lines defines a respective junction with each bit line of the plurality of bit lines; and
a plurality of magnetic tunnel junction devices, wherein a respective magnetic tunnel junction device is located at each respective junction, and wherein at least one magnetic tunnel junction device of the plurality of magnetic tunnel junction devices comprises:
a composite free layer comprising:
a first sub-layer comprising at least one of a Co-based alloy, $Fe_4N$, or a Heusler alloy;
a second sub-layer comprising at least one of a Co-based alloy, $Fe_4N$ or a Heusler alloy; and
an intermediate sub-layer between the first sub-layer and the sub-second layer, wherein the composite free layer exhibits a magnetic easy axis oriented out of a plane of the composite free layer;
a reference layer; and
a tunnel barrier layer between the composite free layer and the reference layer.

21. The SOT-MRAM device of claim 20, wherein the composite free layer exhibits a magnetic easy axis oriented substantially perpendicular to the plane of the composite free layer.

22. The SOT-MRAM device of claim 20, wherein the intermediate sub-layer comprises a rare earth element, and wherein the rare earth element comprises at least one of gadolinium, terbium, dysprosium, or holmium.

23. The SOT-MRAM device of claim 20, wherein at least one of the first sub-layer or the second sub-layer comprises CoFeB.

24. The SOT-MRAM device of claim 20, wherein:
at least one of the first sub-layer or the second sub-layer comprises the Heusler alloy; and
the Heusler alloy comprises at least one of $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Co_2NiGa$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, or $Co_2FeGe$.

25. The SOT-MRAM device of claim 20, wherein the composite free layer has a saturation magnetization of less than about 400 $emu/cm^3$.

26. The SOT-MRAM device of claim 20, wherein the tunnel barrier layer comprises MgO.

27. The SOT-MRAM device of claim 20, wherein the composite free layer is a first free layer and the tunnel barrier layer is a first tunnel barrier layer, further comprising a second free layer and a second tunnel barrier layer, wherein the first tunnel barrier layer is between the first free layer and the second free layer, and wherein the second tunnel barrier layer is between the second free layer and the reference layer.

28. The SOT-MRAM device of claim 27, wherein the second free layer comprises a CoFeB alloy, and wherein each of the first and second tunnel barrier layers comprises MgO.

29. The SOT-MRAM device of claim 20, further comprising a spin orbit torque (SOT) generating layer adjacent to the composite free layer, wherein the composite free layer is between SOT generating layer and the tunnel barrier layer.

30. The SOT-MRAM device of claim 29, wherein the SOT generating layer comprises at least one of the SOT generating layer comprises at least one of PtMn, IrMn, TaW alloy, Ta/W multilayer, $Bi_xSe_{(1-x)}$, $BixTe_{(1-x)}$, or $Sb_xTe_{(1-x)}$, $(BiSb)_x(TeSe)_{(1-x)}$, wherein x is greater than 0 and less than 1.

* * * * *

UNITED STATES PATENT AND TRADEMARK OFFICE
CERTIFICATE OF CORRECTION

PATENT NO. : 10,354,709 B2
APPLICATION NO. : 15/730405
DATED : July 16, 2019
INVENTOR(S) : Jian-Ping Wang et al.

Page 1 of 1

It is certified that error appears in the above-identified patent and that said Letters Patent is hereby corrected as shown below:

In the Claims

Column 14, Line 42 (Claim 12): Replace "further further" with --further comprises--

Signed and Sealed this
Fourteenth Day of April, 2020

Andrei Iancu
*Director of the United States Patent and Trademark Office*